US012604550B2

(12) United States Patent
Wang et al.

(10) Patent No.: US 12,604,550 B2
(45) Date of Patent: Apr. 14, 2026

(54) IMAGE SENSOR AND METHOD FOR REDUCING IMAGE SIGNAL PROCESSOR

(71) Applicant: VisEra Technologies Company Limited, Hsin-Chu (TW)

(72) Inventors: Chun-Yuan Wang, Hsin-Chu (TW);
Chih-Ming Wang, Hsin-Chu (TW);
Po-Hsiang Wang, Hsin-Chu (TW);
Han-Lin Wu, Hsin-Chu (TW)

(73) Assignee: VISERA TECHNOLOGIES COMPANY LIMITED, Hsin-Chu City (TW)

( * ) Notice: Subject to any disclaimer, the term of this patent is extended or adjusted under 35 U.S.C. 154(b) by 451 days.

(21) Appl. No.: 18/173,505

(22) Filed: Feb. 23, 2023

(65) Prior Publication Data

US 2024/0021634 A1 Jan. 18, 2024

Related U.S. Application Data

(60) Provisional application No. 63/389,149, filed on Jul. 14, 2022.

(51) Int. Cl.
*H10F 39/00* (2025.01)
*H04N 25/13* (2023.01)
*H04N 25/133* (2023.01)

(52) U.S. Cl.
CPC ....... *H10F 39/8053* (2025.01); *H04N 25/133* (2023.01); *H04N 25/135* (2023.01); *H10F 39/8057* (2025.01)

(58) Field of Classification Search
CPC ............. H10F 39/8053; H10F 39/8057; H10F 39/024; H10F 39/199; H10F 39/805;

H10F 39/8063; H10F 39/182; H10F 39/806; H10F 39/807; H04N 25/133; H04N 25/135; H04N 25/13; H04N 23/81; H04N 23/843; H04N 23/88; H04N 25/11
See application file for complete search history.

(56) References Cited

U.S. PATENT DOCUMENTS

| | | | |
|---|---|---|---|
| 2007/0145505 A1* | 6/2007 | Kim | H10F 39/024 |
| | | | 257/432 |
| 2011/0242350 A1* | 10/2011 | Sawayama | H10F 77/413 |
| | | | 257/E31.127 |

(Continued)

FOREIGN PATENT DOCUMENTS

| | | |
|---|---|---|
| CN | 110120398 A | 8/2019 |
| JP | 2003-344141 A | 12/2003 |

(Continued)

OTHER PUBLICATIONS

Office Action with its corresponding JP application No. 2023-108203 issued on Jun. 4, 2024 with English translation.

*Primary Examiner* — S M Sohel Imtiaz
(74) *Attorney, Agent, or Firm* — Muncy, Geissler, Olds & Lowe, P.C.

(57) ABSTRACT

An image sensor includes groups of sensor units, and a color filter layer having color units that disposed within the groups of sensor units, respectively. The color units of the color filter layer include a yellow color unit or a white color unit. The image sensor further includes a dielectric structure disposed on the color filter layer, and a meta surface disposed on the dielectric structure.

17 Claims, 8 Drawing Sheets

(56)         References Cited

U.S. PATENT DOCUMENTS

| | | | | |
|---|---|---|---|---|
| 2012/0008039 A1* | 1/2012 | Del Monte | ......... | H10F 39/8063 |
| | | | | 348/360 |
| 2016/0047690 A1* | 2/2016 | Yun | ....................... | H10F 39/024 |
| | | | | 250/206 |
| 2016/0353034 A1* | 12/2016 | Mauritzson | .......... | H04N 25/778 |
| 2017/0170220 A1* | 6/2017 | Nam | ................... | H10F 39/8053 |
| 2017/0263662 A1* | 9/2017 | Hsieh | .................... | H10F 39/806 |
| 2019/0214421 A1* | 7/2019 | Kim | ...................... | H10F 39/024 |
| 2020/0219913 A1* | 7/2020 | Lee | ........................ | H04N 25/00 |
| 2020/0373343 A1* | 11/2020 | Nam | ...................... | G02B 5/207 |
| 2022/0262863 A1* | 8/2022 | Dupoiron | ............. | H10F 39/806 |
| 2022/0328535 A1* | 10/2022 | Huang | ................ | H10F 39/8037 |
| 2023/0040060 A1* | 2/2023 | Kang | ................... | H10F 39/024 |
| 2023/0207589 A1* | 6/2023 | Sun | ..................... | H10F 39/8063 |
| | | | | 257/443 |
| 2024/0006425 A1* | 1/2024 | Yang | .................. | H10F 39/8057 |

FOREIGN PATENT DOCUMENTS

| | | | | |
|---|---|---|---|---|
| JP | 2018-113542 A | 7/2018 | | |
| JP | 2019-012426 A | 1/2019 | | |
| JP | 2019-197098 A | 11/2019 | | |
| JP | 2022-075462 A | 5/2022 | | |
| JP | 2022-076999 A | 5/2022 | | |
| TW | I660492 B | 5/2019 | | |
| TW | 202220201 A | 5/2022 | | |
| TW | 202224170 A | 6/2022 | | |
| WO | WO2015/019913 A1 | 2/2015 | | |
| WO | WO2020/146029 A2 | 7/2020 | | |
| WO | WO-2021136469 A1 * | 7/2021 | .......... | H10F 39/024 |

* cited by examiner

IMAGE SENSOR AND METHOD FOR REDUCING IMAGE SIGNAL PROCESSOR

CROSS REFERENCE TO RELATED APPLICATIONS

This application claims priority of provisional application of U.S. Patent Application No. 63/389,149 filed on Jul. 14, 2022, the entirety of which is incorporated by reference herein.

BACKGROUND

Technical Field

The present disclosure relates to an image sensor and a method operating the same, and in particular it relates to a meta surface of an image sensor.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light-sensing portion of an image sensor can detect ambient color changes, and signal electric charges may be generated, depending on the amount of light received in the light-sensing portion. In addition, the signal electric charges generated in the light-sensing portion may be transmitted and amplified, whereby an image signal may be obtained.

Some image sensors may replace the green color filter units in the standard Bayer mosaic pattern (which is sampled by red, green, and blue color filter units) by a less absorbing or non-absorbing material. This type of sensor units can enhance the light sensitivity, thereby improving the performance of the image sensors, especially in an environment of low luminance. However, since the less-absorbing material may allow a light ray of a wider wave band to be transmitted, processing such sensor units requires using a higher color-correction coefficient. Moreover, the higher sensitivity of such sensor units may result in color-channel imbalance, which requires a higher white-balance coefficient to correct. In comparison with processing the Bayer pattern mosaic, processing the sensor units utilizing less-absorbing or non-absorbing materials may generate higher levels of color error and color noise. Therefore, these and related issues need to be addressed through the design and manufacture of the image sensor.

SUMMARY

In an embodiment, an image sensor includes groups of sensor units, and a color filter layer having color units that disposed within the groups of sensor units, respectively. The color units of the color filter layer include a yellow color unit or a white color unit. The image sensor further includes a dielectric structure disposed on the color filter layer, and a meta surface disposed on the dielectric structure.

In another embodiment, a method for reducing an image signal processor (ISP) includes: capturing image signals using an image sensor; applying a color correction matrix (CCM) on the image signals; demosaicing the image signals; and performing exposure contrast, white balance, and denoise on the image signals. The image sensor includes: groups of sensor units; a color filter layer having color units disposed within groups of sensor units, respectively; a dielectric structure disposed on the color filter layer; and a meta surface disposed on the dielectric structure. The color units include a yellow color unit or a white color unit.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
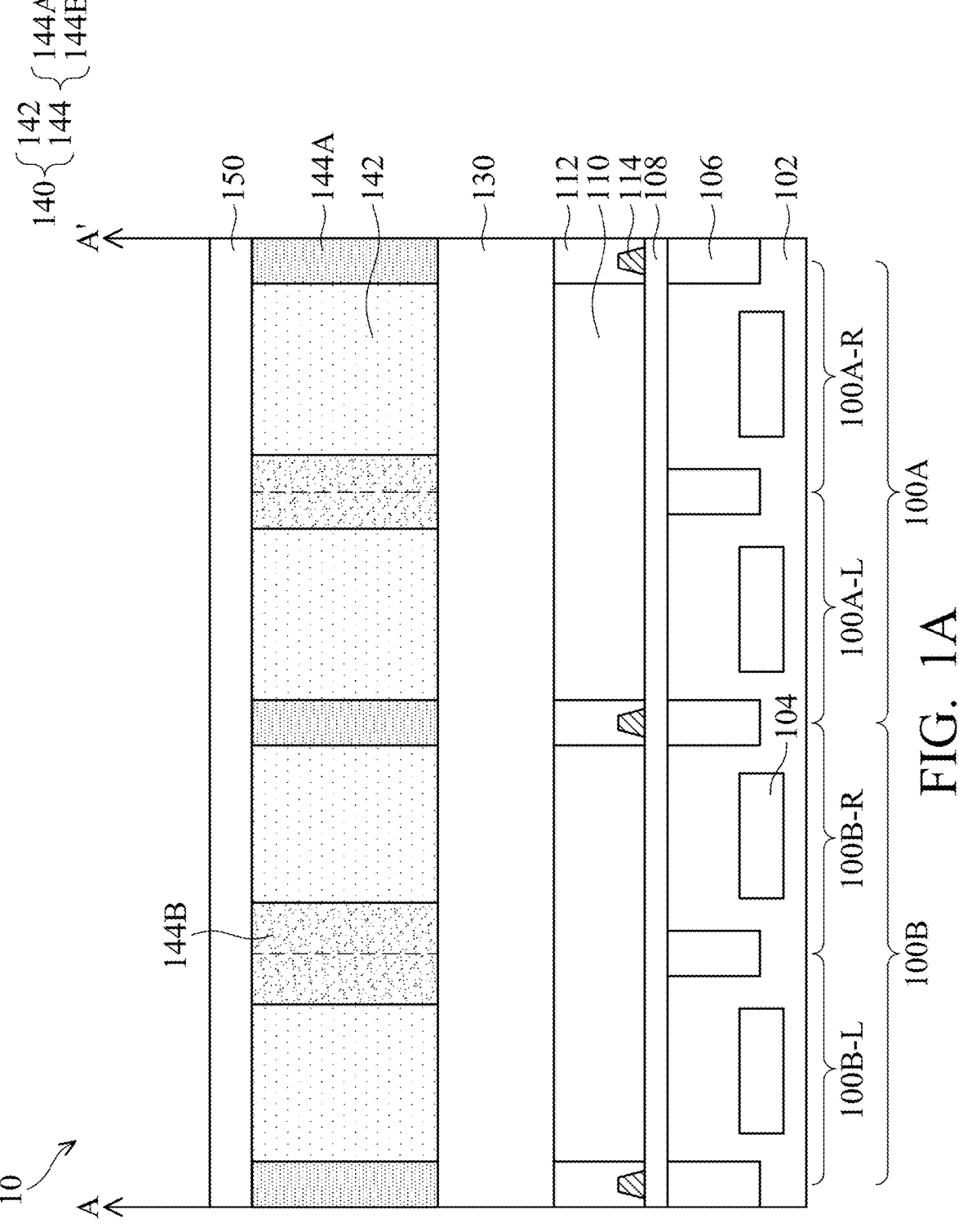
FIG. 1A is a cross-sectional view of an image sensor, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In response to the continually reduced pixel size, light reception of each pixel, and light reception uniformity between pixels have become a critical concern. One method of enhancing the light reception uniformity of smaller pixels among the image sensor is to integrate multiple sensor units into a group. According to some embodiments of the present disclosure, when light is evenly received by each sensor unit within the group, the image sensor can display image of unifying color. However, if light received by each sensor unit is uneven, then the image sensor would experience color variation. While the group of sensor units may detect and track image focus for the overall device, it also allows the determination of color by signals received. For example, when light is entered at an inclined angle, one of the sensor units within the group may receive more light than another sensor unit, and thus based on the signal reading between the sensor units, the entry light direction may be accurately determined.

In nature, light may be a combination of various colors of all wave bands. A conventional image sensor may converge an incident light ray through a micro-lens. After that, the converged light ray may be transmitted through an underlying color filter layer. The color filter layer may allow the desired color to transmit, and may absorb the unwanted colors. Even though the conventional image sensor may ensure that the desired colors are to be received by the corresponding sensor units, the other colors being absorbed may still represent a portion of the optical energy loss. When each of the group of sensor units acquires only a certain amount of the entire optical energy, the quantum efficiency (QE) of the image sensor may be difficult to improve. Whenever quantum efficiency is inadequate, the device operating in the environment of low luminance (such as a night vision apparatus) or camera within moving vehicles (such as a real time video) may not function properly.

In a Bayer pattern of a pixel, four groups of sensor units are arranged in a 2×2 array, which include a red color unit, a green color unit, a green color unit, and a blue color unit, respectively. In the current industry or the current academia, the Bayer pattern is the only mosaic technology mature enough to address any potential color variation. Therefore, only image signals extracted from the Bayer pattern can be introduced to an image signal processor (ISP), which is a backend fabrication that restores the colored image. It should be understood that the image color and the image resolution are processed separately in the image signal processor, and the processed color and resolution will be combined at a later operation.

In an effort to enhance the quantum efficiency of the image sensor, the green color units may be replaced by yellow color units or white color units. In some embodiments, the white color units may also be considered as clear color units, which may appear similar to a glass medium. The green color units are chosen because they occupy the largest area among the image sensor, which in turn controls the resolution of the image color. Intrinsically, the green color units may have a green color filter material, which includes an absorption material for red wavelength light rays and an absorption material for blue wavelength light rays, so only green wavelength light rays may be transmitted. For the yellow color units, the yellow color wave band may overlap across the green color wave band and the red color wave band, so the yellow color units only include an absorption material for the blue wavelength light rays. Moreover, for the white color units, the white color wave band may overlap across the blue color wave band, the green color wave band, and the red color wave band, so the white color units do not include any absorption materials. Using the color units of less absorbing or non-absorbing filtering materials, a higher transmittance, a higher optical sensitivity, and a more superior resolution in the environment of low luminance (for example, in blackness) may be achieved, thereby improving the quantum efficiency.

For the current technology, the image signals extracted from the yellow color units and the white color units cannot be introduced directly to the standard image signal processor (only signals from the Bayer pattern can be handled by standard the image signal processor). Conventionally, the image signals extracted from the yellow color units or the white color units may need to be converted into signals equivalent to those extracted from the green color units, before the operations of the image signal processor can be carried out. Converting the yellow signals or the white signals into the signals equivalent to those extracted from the green color units may require subtracting away a portion of the yellow signals or the white signals of unwanted wave bands (for example, the red color wave band and/or the blue color wave band). After that, the subtracted signals may be divided by a normalized factor. In addition, the conversion process may require applying a green color coating layer.

It should be understood that since the yellow color units and the white color units occupy the largest area among the image sensor, the conversion process needs to draw a large amount of power. In fact, the power consumption for converting the yellow signals or the white signals into signals equivalent to those extracted from the green color units is almost as much as the power consumption for operating the image signal processor. Consequently, the overall backend fabrication for the yellow color units or the white color units consumes twice the power in comparison with the overall backend fabrication for the Bayer mosaic pattern. Moreover, the unwanted wave bands of the extracted signal may vary, thus the subtraction may not be exact, leading to a less precise conversion. Whenever the converted signals are not precise enough, the color error may occur during the image signal processor operations, and the restored image quality may be compromised.

The present disclosure incorporates a meta surface into the pixel to replace the conventional micro-lens, and to serve as a color router for visible light. The meta surface includes nanostructures (such as nanoposts or pillars) that generate a phase library, which provides the necessary phase difference for colors of different wave bands. When the nanostructures are arranged across the meta surface, a meta lens may be created to diffract the incident light ray of different colors, which can also be known as a band pass filter (or a color routing function). Through designing the dimensions and the pitches of the nanostructures using an algorithm, the colors of the incident light ray may be split and directed toward the corresponding sensor units, respectively.

When the separated light rays of the desired color are transmitted through the underlying color filter layer, the optical energy loss may be eliminated, thereby enhancing quantum efficiency. More specifically, the meta surface may split the red wavelength light ray and the green wavelength light ray, so only the green wavelength light ray may be directed toward the yellow color units. The meta surface may also split the red wavelength light ray, the green wavelength light ray, and the blue wavelength light ray, so only the green wavelength light ray may be directed toward the white color units. Due the presence of the meta surface, the inventor has discovered that converting the yellow signals or the white signals into the signals equivalent to those extracted from the green color units is no longer necessary. As a result, the overall backend fabrication for the yellow color units or the white color units may be carried out with lower power consumption, less probability of color error, and higher green color wave band peak (due to higher transmittance).

FIG. 1A is a cross-sectional view of an image sensor 10, according to some embodiments of the present disclosure. In some embodiments, image sensors may contain millions of sensor units in reality. For the sake of brevity, FIG. 1A only displays a portion of an actual image sensor. The image sensor 10 includes four groups of sensor units 100A, 100B, 100C, and 100D arranged in a 2×2 array from top view, which will be described in more detail with reference to FIG. 1B. According to some embodiments of the present disclosure, the group of sensor units 100A, the group of sensor units 100B, the group of sensor units 100C, and the group of sensor units 100D may constitute a pixel. The 2×2 pixel array may be periodically arranged in cycles across the actual image sensor.

According to some embodiments of the present disclosure, the group of sensor units 100A, the group of sensor units 100B, the group of sensor units 100C, and the group of sensor units 100D may each include four sensor units arranged in a 2×2 array, such as a quad photodiode (QPD). In other embodiments, the group of sensor units 100A, the group of sensor units 100B, the group of sensor units 100C, and the group of sensor units 100D may each include two sensor units arranged in a 1×2 array, such as a dual photodiode (DPD). For example, the group of sensor units 100A, the group of sensor units 100B, the group of sensor units 100C, and the group of sensor units 100D may each correspond to m×n photoelectric conversion elements, in which m and n are positive integers that can be the same or different, but the present disclosure is not limited thereto. For illustrative purpose, the group of sensor units 100A and the group of sensor units 100B shown in FIG. 1A both include one left sensor unit and one right sensor unit. In particular, the group of sensor units 100A includes a left sensor unit 100A-L and a right sensor unit 100A-R, and the group of sensor units 100B includes a left sensor unit 100B-L and a right sensor unit 100B-R.

Please note that, as shown in FIG. 1A, a dielectric structure 130, a meta surface 140, and a protective film 150 may be sequentially disposed above a color filter layer 110. The color filter layer 110 may include color units within the group of sensor units 100A and the group of sensor units 100B, respectively. According to some embodiments of the present disclosure, the meta surface 140 may include a filling material 142 and a plurality of nanostructures 144. Moreover, the plurality of nanostructures 144 may include peripheral nanoposts 144A and central nanoposts 144B. The features of the meta surface 140 will be described with more details. As shown in FIG. 1A, a deep trench isolation (DTI) structure 106 may be disposed surrounding each of the left sensor unit 100A-L, the right sensor unit 100A-R, the left sensor unit 100B-L, and the right sensor unit 100B-R. In other words, the deep trench isolation structure 106 may serve as a boundary that defines the size of each of the left sensor unit 100A-L, the right sensor unit 100A-R, the left sensor unit 100B-L, and the right sensor unit 100B-R.

Referring to FIG. 1A, the group of sensor units 100A and the group of sensor units 100B (also, the group of sensor units 100C and the group of sensor units 100D) may each include a plurality of sensing portions 104 and a color unit of the color filter layer 110. The plurality of sensing portions 104 and the deep trench isolation structure 106 may be embedded in a substrate 102. In some embodiments, the substrate 102 may be a single structure shared by all sensor units of the image sensor 10. Furthermore, an anti-reflection layer 108 may be disposed on the substrate 102.

In some embodiments, the substrate 102 may be, for example, a wafer or a chip, but the present disclosure is not limited thereto. In some embodiments, the substrate 102 may be a semiconductor substrate, for example, silicon substrate. Furthermore, in some embodiments, the semiconductor substrate may also be an elemental semiconductor (such as germanium), a compound semiconductor (such as gallium nitride (GaN), silicon carbide (SiC), gallium arsenide (GaAs), gallium phosphide (GaP), indium phosphide (InP), indium arsenide (InAs), or indium antimonide (InSb)), an alloy semiconductor (such as silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, or gallium indium arsenide phosphide (GaInAsP) alloy), or a combination thereof. In some embodiments, the substrate 102 may be a photoelectric conversion substrate, such as a silicon substrate or an organic photoelectric conversion layer.

In other embodiments, the substrate 102 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 102 may be an n-type or a p-type conductive type.

In some embodiments, the substrate 102 may include various p-type doped regions and/or n-type doped regions (not shown) formed by, for example, an ion implantation and/or a diffusion process. In some embodiments, transistors, photodiodes, or the like, may be formed at the active regions, which are defined by the deep trench isolation structure 106.

In some embodiments, the deep trench isolation structure 106 may define active regions and electrically isolate active region elements within or above the substrate 102, but the present disclosure is not limited thereto. In other embodiments, additional isolation structures may be applied as an alternative. Shallow trench isolation (STI) structures and local oxidation of silicon (LOCOS) structures are examples of other isolation structures. In some embodiments, the formation of the deep trench isolation structure 106 may include, for example, forming an insulating layer on the substrate 102. Through a photolithography patterning and etching, trenches may be formed extending into the substrate 102. The photolithography process may include resist coating, soft baking, exposure, post-exposure baking, development, the like, or a combination thereof. The etching process may include dry etching, wet etching, the like, or a combination thereof.

Next, a liner of rich nitrogen-containing materials (such as silicon oxynitride (SiON)) may be grown conformally along the trenches. After that, insulating materials (such as silicon dioxide (SiO$_2$), silicon nitride (SiN), or silicon oxynitride) may be filled into the trenches by a suitable deposition process, such as chemical vapor deposition (CVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), the like, or a combination thereof. An annealing process may then be performed on the insulating materials in the trenches, followed by a planarization process, such as chemical mechanical polish (CMP), on the substrate 102 to remove excessive insulating materials, so the insulating materials in the trenches are level with the top surface of the substrate 102.

Still referring to FIG. 1A, the plurality of sensing portions 104 are embedded in the substrate 102. In some embodiments, the plurality of sensing portions 104 are photodiodes. Each of the plurality of sensing portions 104 is configured to sense light and generate an intensity signal according to the intensity of the light it senses. The image signal is formed by the intensity signals, and may be numerical data or readings of the electron amount. The image signal data captured by the plurality of sensing portions 104 may be introduced to the image signal processor. As mentioned previously, the image signal processor is a backend fabrication that restores the image color, which will be described in more detail with reference to FIG. 2.

Referring to FIG. 1A, the anti-reflection layer 108 may be disposed on the substrate 102. In some embodiments, the anti-reflection layer 108 is configured to decrease the reflection of the light being transmitted to the plurality of sensing portions 104. In some embodiments, the anti-reflection layer 108 is disposed horizontally in correspondence (or parallel with respect) to the array of sensing portions 104. In some embodiments, the materials of the anti-reflection layer 108 may include silicon oxynitride (SiO$_x$N$_y$, wherein x and y are in the range of 0 to 1). The anti-reflection layer 108 may be formed by any of the suitable deposition processes that are mentioned above.

As mentioned above, the group of sensor units 100A, the group of sensor units 100B, the group of sensor units 100C, and the group of sensor units 100D may each include a color unit of the color filter layer 110 that is disposed on the anti-reflection layer 108. In some embodiments, the color units of the color filter layer 110 may be colored red, green, blue, cyan, magenta, yellow, white, clear (colorless), or infrared. Each color unit of the color filter layer 110 may correspond to the respective sensing portions 104 within each of the group of sensor units 100A, the group of sensor units 100B, the group of sensor units 100C, and the group of sensor units 100D of the image sensor 10, and the color of the color unit depends on the requirements of each of the group of sensor units 100A, the group of sensor units 100B, the group of sensor units 100C, and the group of sensor units 100D. For example, the group of sensor units 100A, the group of sensor units 100B, the group of sensor units 100C, and the group of sensor units 100D may include the red color unit, the yellow color unit, the yellow color unit, and the blue color unit, respectively, in which the green color units of a typical Bayer pattern are replaced by the yellow color units.

As mentioned previously, the image sensor 10 incorporates the meta surface 140 to separate the colors of the incident light ray, so the separated light rays with only the desired colors may be received by the sensor units, respectively. However, in reality, the meta surface 140 cannot guarantee a complete separation of colors. Therefore, the separated light rays may still include a slight amount of unwanted colors. The presence of the color filter layer 110 may still be necessary to ensure that the slight amount of the unwanted colors is absorbed to eliminate any potential color noise. Furthermore, when the yellow color units are designed to transmit the red wavelength light ray and the green wavelength light ray, the meta surface 140 may split the red wavelength light ray and the green wavelength light ray, so only the green wavelength light ray may be directed toward the yellow color units. Due to the presence of the meta surface 140, it is no longer necessary to convert the yellow signals into the signals equivalent to those extracted from the green color units. As a result, the overall backend fabrication for the yellow color units may be carried out with lower power consumption, less probability of color error, and higher green color wave band peak (due to higher transmittance).

In some embodiments, each color unit of color filter layer 110 allows a predetermined range of wavelengths of light to pass through. For example, the red color filter units allow wavelengths of light in a range from 620 nm to 750 nm (red light) to transmit to the corresponding sensing portions 104, the green color filter units allow wavelengths of light in a range from 495 nm to 570 nm (green light) to transmit to the corresponding sensing portions 104, and the blue color filter units allow wavelengths of light in a range from 450 nm to 495 nm (blue light) to transmit to the corresponding sensing portions 104.

In some embodiments, the height of the color filter layer 110 may be between 0.3 μm and 2.0 μm. In a particular embodiment, the height of the color filter layer 110 may be approximately 0.7 μm. According to some embodiments of the present disclosure, the refractive index of each unit of the color filter layer 110 may be between 1.2 and 2.2. The refractive index is a characteristic of a substance that changes the speed of light, and it is a value obtained by dividing the speed of light in vacuum by the speed of light in the substance. When light travels between two different materials at an angle, its refractive index determines the angle of light transmission (refraction).

As stated above, the respective sensing portions 104, such as photodiodes, may convert received light signals into electric signals for each of the group of sensor units 100A, the group of sensor units 100B, the group of sensor units 100C, and the group of sensor units 100D. In some embodiments, the sensor units within the same group may share the same color unit. In some embodiments, the group of sensor units 100A, the group of sensor units 100B, the group of sensor units 100C, and the group of sensor units 100D are separated from each other by a partition grid structure 112, which will be explained in detail later. According to some embodiments of the present disclosure, the color filter layer 110 is deposited on the anti-reflection layer 108 and in the space defined by the partition grid structure 112. The color filter layer 110 may be formed in sequence by a coating, exposure, and development process at different steps. Alternatively, the color filter layer 110 may be formed by ink-jet printing.

Still referring to FIG. 1A, the partition grid structure 112 is disposed between one or more color units of the color filter layer 110. For example, the center line (not shown) of the partition grid structure 112 may define the border of the group of sensor units 100A and the group of sensor units 100B. The partition grid structure 112 may have a lower refractive index than each color unit of the color filter layer 110. According to some embodiments of the present disclosure, the refractive index of the partition grid structure 112 is between 1.0 and 1.6. When the incident light ray enters the color filter layer 110, the partition grid structure 112 may isolate the light ray within the specific color unit to serve as the light-trapping function.

Materials of the partition grid structure 112 may include a transparent dielectric material. At first, a partition material layer is coated on the anti-reflection layer 108. Next, a hard mask layer (not shown) is coated on the partition material layer. In some embodiments, the material of the hard mask layer may be a photoresist. A photolithography process is performed on the hard mask layer for patterning. Next, an etching process is performed on the partition material layer by using the patterned hard mask layer. The etching process may be dry etching. After the etching process, a portion of the partition material layer is removed on the anti-reflection layer 108, and multiple openings are formed therein. As mentioned previously, the openings will be subsequently filled with the color filter layer 110.

Referring to FIG. 1A, a light shielding structure 114 is disposed on the anti-reflection layer 108 between the group of sensor units 100A and the group of sensor units 100B. In some embodiments, the light shielding structure 114 is embedded within the partition grid structure 112. In some embodiments, the partition grid structure 112 may be higher than or equal to the light shielding structure 114, depending on the design requirements for the image sensor 10. In some embodiments, the light shielding structure 114 spans across the border of the group of sensor units 100A and the group of sensor units 100B. In other words, the light shielding structure 114 may be disposed in such a way that it is shared by any two adjacent sensor units (for example, the left sensor unit 100A-L and the right sensor unit 100B-R). The arrangement of the light shielding structure 114 may prevent one of the sensing portions 104 under the corresponding color unit of the color filter layer 110 to receive additional light from an adjacent color unit of different color, which may affect the accuracy of signals received. In some embodiments of the present disclosure, the height of the light shielding structure 114 may be between 0.005 µm and 0.4 µm. In some embodiments, materials of the light shielding structure 114 may include opaque metals (such as tungsten (W), aluminum (Al)), opaque metal nitride (such as titanium nitride (TiN)), opaque metal oxide (such as titanium oxide (TiO)), other suitable materials, or a combination thereof, but the present disclosure is not limited thereto. The light shielding structure 114 may be formed by depositing a metal layer on the anti-reflection layer 108 and then patterning the metal layer using photolithography and etching processes, but the present disclosure is not limited thereto.

Referring to FIG. 1A, the dielectric structure 130 may be disposed on the color filter layer 110. In some embodiments, the dielectric structure 130 may cover the color filter layer 110 and the partition grid structure 112. According to some embodiments of the present disclosure, the dielectric structure 130 may provide the necessary travel path for the light rays of different diffractions to reach their respective targets. The refractive index of the dielectric structure 130 is between 1.2 and 2.2. Moreover, the refractive index of the dielectric structure 130 is significantly lower than that of the subsequently formed nanostructures 144. According to some embodiments of the present disclosure, the thickness of the dielectric structure 130 may be between 0.1 µm and 3 µm. It should be understood that ideally, the thickness of the dielectric structure 130 should be maintained as small as possible. The dimension of the dielectric structure 130 may determine the traveling path of the separated light rays of the desired color. Because a thinner dielectric structure 130 may require a larger phase difference, which is fine-tuned by the meta surface 140 in order to adjust the propagating angles of the light rays, the separated light rays of the respective colors may travel toward the designated targets more accurately. However, when the thickness of the dielectric structure 130 is set too small, the fabrication of the meta surface 140 would be too difficult.

In some embodiments, the dielectric structure 130 may be a transparent material including, for example, silicon oxide (SiO), silicon nitride, silicon carbide, silicon carbonitride (SiCN), silicon oxynitride, silicon oxynitrocarbide (Si-$O_xN_yC_{1-x-y}$, wherein x and y are in a range from 0 to 1), tetra ethyl ortho silicate (TEOS), undoped silicate glass, or doped silicon oxide (such as boron-doped phosphosilicate glass (BPSG), fused silica glass (FSG), phosphosilicate glass (PSG), boron doped silicon glass (BSG), or the like), low-k dielectric materials, organic transparent materials, the like, or a combination thereof, but the present disclosure is not limited thereto. The formation of the dielectric structure 130 may include deposition processes, which may include, for example, spin-on coating process, chemical vapor deposition, physical vapor deposition (PVD), atomic layer deposition (ALD), other suitable methods, or a combination thereof. After that, a planarization process, such as chemical mechanical polish, may be performed to form a planarized top surface.

Referring to FIG. 1A, the meta surface 140 may be disposed on the planarized top surface of the dielectric structure 130. When the meta surface 140 is being integrated into the image sensor 10, the meta surface 140 needs to be designed conforming to the dimension of the group of sensor units 100A and the group of sensor units 100B. In some embodiments, the meta surface 140 may be designed to separate the colors of the incident light ray. The colors of the incident light ray may be split using diffraction or scattering characteristics of light that differs depending on wavelengths, and the transmitting directions of the separated light rays may be adjusted by their respective wavelengths according to the refractive indices and shapes of the meta surface 140. The separated light rays of different colors may be directed toward the corresponding color units. When the image sensor 10 incorporates the meta surface 140, the color units of the color filter layer 110 may receive only the desired color of the incident light ray (since the colors of the incident light ray were previously separated by the overlying meta surface 140).

As mentioned previously, the meta surface 140 may include the filling material 142 and the plurality of nanostructures 144. In some embodiments, the filling material 142 may laterally surround the plurality of nanostructures 144. When the meta surface 140 is incorporated into the image sensor 10, the incident light ray entering the image sensor 10 at a normal direction may be split based on its colors before the incident light ray is being transmitted through the underlying color filter layer 110. Such configuration allows for each color unit of the color filter layer 110 to receive the maximum optical energy of the desired color.

In other words, optical energy loss may be minimized, while quantum efficiency may be enhanced. In some embodiments, quantum efficiency is the photoelectrical transferring efficiency, which is a measure of how efficient incident light rays can be converted into electrical signals.

In some embodiments, the meta lens created by the plurality of nanostructures 144 may cover a larger effective collected area than a conventional micro-lens. For example, when one of the blue color units is surrounded by the red color units and the green color units, the meta lens may cover the collected area that spans across the blue color unit itself, two adjacent units in the horizontal direction, two adjacent units in the vertical direction, and four adjacent units in the diagonal direction (a total of 9 color units). Such configuration allows the blue color unit to draw additional energy of the blue color wave band from the diagonally adjoined red color units and the horizontally and vertically adjoined green color units, thereby enhancing the quantum efficiency. However, since the green color units of the Bayer pattern typically occupy 50% of the area among the image sensor, they tend to be placed adjacent with each other along the diagonal direction. The meta lens for the green color units may cover a limited effective collected area, because a green color unit cannot draw additional energy of the green color wave band from another green color unit. With this reason, replacing the green color units with the yellow color units or the white color units of higher transmittance can compensate the disadvantage of the limited effective collected area, in order to obtain an approximately 10% increase in the green color wave band peak of the quantum efficiency spectrum.

According to some embodiments of the present disclosure, when the yellow color units are designed to transmit the red wavelength light ray and the green wavelength light ray, the meta surface 140 may split the red wavelength light ray and the green wavelength light ray, so only the green wavelength light ray may be directed toward the yellow color units. Due to the presence of the meta surface 140, it is no longer necessary to convert the yellow signals into the signals equivalent to those extracted from the green color units. As a result, the overall backend fabrication for the yellow color units may be carried out with lower power consumption, less probability of color error, and higher green color wave band peak (due to higher transmittance).

The thickness of the meta surface 140 is between 200 nm and 1.5 μm. In some embodiments, the filling material 142 and the plurality of nanostructures 144 may be the same thickness. In alternative embodiments, the thickness of the filling material 142 and that of the plurality of nanostructures 144 may vary, depending on the application and the design requirements. According to some embodiments of the present disclosure, the refractive index of the plurality of nanostructures 144 is higher than the refractive index of the filling material 142. The refractive index of the filling material 142 may be between 1.0 and 1.7. The refractive index of the plurality of nanostructures 144 may be between 1.8 and 3.5. In some embodiments, the filling material 142 may be air. It is worth noted that, when the plurality of nanostructures 144 are surrounded by ambient air (which has a refractive index of 1), the largest difference between the refractive indices may be realized to generate a significantly broader phase difference, so the incident light ray may be more easily separated based on the wave bands of the respective colors. When the incident light ray of different colors comes in contact with a certain nanostructure 144, the color of longer wavelength may view the nanostructure 144 differently form the color of shorter wavelength, thus the phase difference is generated.

As shown in FIG. 1A, the peripheral nanoposts 144A of the plurality of nanostructures 144 may be located at the perimeter of the group of sensor units 100A and the perimeter of the group of sensor units 100B. The central nanoposts 144B of the plurality of nanostructures 144 may be located within the group of sensor units 100A and the group of sensor units 100B. For example, they may be located at the center point of the group of sensor units 100A and at the center point of the group of sensor units 100B. The peripheral nanoposts 144A and the central nanoposts 144B of the plurality of nanostructures 144 may be laterally surrounded by the filling material 142. Materials of the filling material 142 may include transparent resins, such as polyethylene terephthalate (PET) resins, polycarbonate (PC) resins, polyimide (PI) resins, polymethylmethacrylates (PMMA), polystyrene resins, polyethersulfone (PES) resins, polythiophene (PT) resins, phenol novolac (PN), the like, or a combination thereof. Materials of the plurality of nanostructures 144 may include transparent conductive materials, such as indium tin oxide (ITO), tin oxide (SnO), indium zinc oxide (IZO), indium gallium zinc oxide (IGZO), indium tin zinc oxide (ITZO), antimony tin oxide (ATO), aluminum-doped zinc oxide (AZO), titanium dioxide (TiO$_2$), tantalum pentoxide (Ta$_2$O$_5$), niobium (V) oxide (Nb$_2$O$_5$), silicon nitride, gallium nitride, aluminum nitride (AlN), the like, or a combination thereof. The meta surface 140 may be formed by any of the suitable deposition processes and patterning processes that are mentioned above.

Still referring to FIG. 1A, the protective film 150 may be disposed on the meta surface 140. In some embodiments, the protective film 150 may conformally cover the meta surface 140, and may provide mechanical protection and electrical insulation for the underlying structures. The refractive index of the protective film 150 is approximately between 1.4 and 1.6. The thickness of the protective film 150 may be between 5 nm and 200 nm. The materials and the formation of the protective film 150 are similar to those of the dielectric structure 130, and the details are not described again herein to avoid repetition.

Figure 1B:
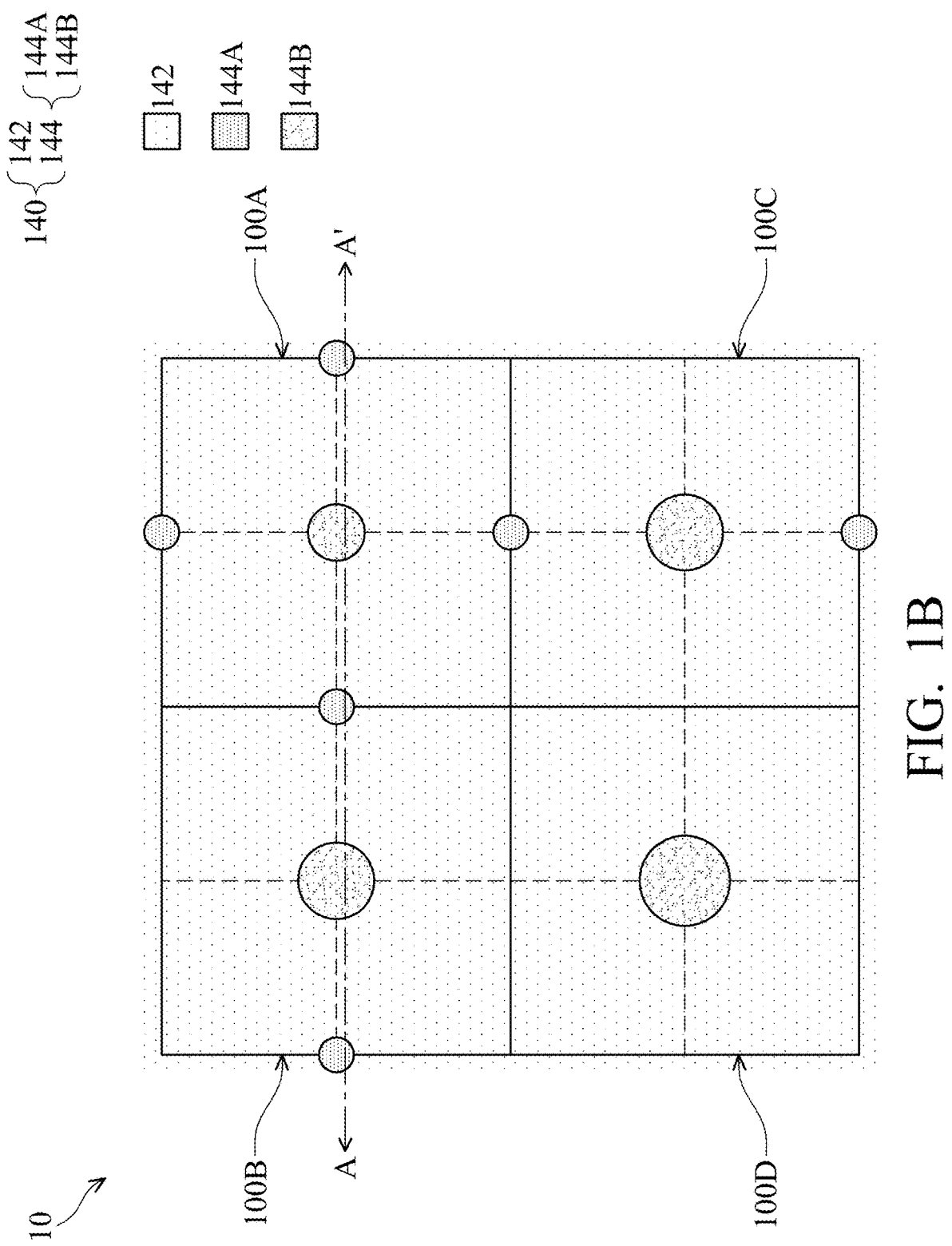
FIG. 1B is a top view of the image sensor, according to some embodiments of the present disclosure.

FIG. 1B is a top view of the image sensor 10, according to some embodiments of the present disclosure. It should be noted that FIG. 1A is the cross-sectional view obtained from a line A-A' of FIG. 1B. As mentioned previously, the group of sensor units 100A, the group of sensor units 100B, the group of sensor units 100C, and the group of sensor units 100D may constitute a pixel with binning mode. The 2×2 pixel array may be periodically arranged in cycles across the actual image sensor. Moreover, the group of sensor units 100A, the group of sensor units 100B, the group of sensor units 100C, and the group of sensor units 100D may each include four sensor units arranged in 2×2. For illustrative purpose, the substrate 102, the sensing portions 104, the deep trench isolation structure 106, the anti-reflection layer 108, the color filter layer 110, the partition grid structure 112, the light shielding structure 114, the dielectric structure 130, and the protective film 150 are omitted. The features of the filling material 142 and the plurality of nanostructures 144 are similar to those illustrated in FIG. 1A, and the details are not described again herein to avoid repetition.

Referring to FIG. 1B, the peripheral nanoposts 144A are disposed in such a way that they are shared by adjacent groups of sensor units, since the group of sensor units 100A, the group of sensor units 100B, the group of sensor units 100C, and the group of sensor units 100D of the pixel are arranged in a 2×2 array from top view, and the pixel array is periodically arranged in cycles. In contrast, the central nanoposts 144B are located within the group of sensor units 100A, the group of sensor units 100B, the group of sensor units 100C, and the group of sensor units 100D, thus they are not shared by adjacent groups of sensor units. In principle, the plurality of nanostructures 144 are present at all of the grid points intersected by grid lines that define every sensor unit of the group of sensor units 100A, the group of sensor units 100B, the group of sensor units 100C, and the group of sensor units 100D. More specifically, the plurality of nano-structures 144 are placed at every corner of every sensor unit. However, as the size of the sensor units continues to reduce, the distribution of the plurality of nanostructures 144 has also become denser (or more "crowded"). The denser configuration of the plurality of nanostructures 144 may directly restrict the adjustable range of the dimension (such as the diameter) of every nanostructure 144. With limited dimensional adjustment of the plurality of nanostructures 144 possible, the generation of a phase difference may not be sufficient enough to separate colors of certain wave bands. For example, the nanostructures 144 may be able to generate the necessary phase difference for blue light due to its shorter wavelength. However, the efficiency of generating the necessary phase difference for red light or green light, which have a longer wavelength, may be severely compromised.

In an effort to improve the phase difference, some of the original peripheral nanoposts 144A are removed, leaving more space for the central nanopost 144B to more freely adjust its dimension. From an alternative point of view, instead of considering some of the peripheral nanoposts 144A being removed, they may also be viewed as being shrunken into an infinitely small dimension. The dimension of each of the plurality of nanostructures 144 from top view may be between 90 nm and 1 µm. Even though the plurality of nanostructures 144 are illustrated as circular shapes from top view, but the present disclosure is not limited thereto. The plurality of nanostructures 144 may have any suitable geometric shape, as long as the necessary phase difference is generated. It should be understood that the shape of the plurality of nanostructures 144 should be symmetrical with respect to the center point of each nanostructure 144. A circular shape has been chosen due to its omnidirectional nature. The minimum pitch between adjacent nanostructures 144 (for example, between two peripheral nanoposts 144A, between two central nanoposts 144B, or between a peripheral nanopost 144A and a central nanopost 144B) is half the dimension of each of the group of sensor units 100A, the group of sensor units 100B, the group of sensor units 100C, and the group of sensor units 100D.

Still referring to FIG. 1B, in a specific embodiment of the present disclosure, the group of sensor units 100A, the group of sensor units 100B, the group of sensor units 100C, and the group of sensor units 100D may include the red color unit, the yellow color unit, the yellow color unit, and the blue color unit, respectively. It should be noted that the group of sensor units 100B and the group of sensor units 100C both include the yellow color units, thus the plurality of nanostructures 144 (for example, the peripheral nanoposts 144A and the central nanoposts 144B) of the group of sensor units 100B and the group of sensor units 100C may have the same configuration. When the yellow color units are designed to transmit the red wavelength light ray and the green wavelength light ray, the meta surface 140 may split the red wavelength light ray and the green wavelength light ray, so only the green wavelength light ray may be directed toward the yellow color units. Due to the presence of the meta surface 140, it is no longer necessary to convert the yellow signals into the signals equivalent to those extracted from the green color units. As a result, the overall backend fabrication for the yellow color units may be carried out with lower power consumption, less probability of color error, and higher green color wave band peak (due to higher transmittance).

Figure 2:
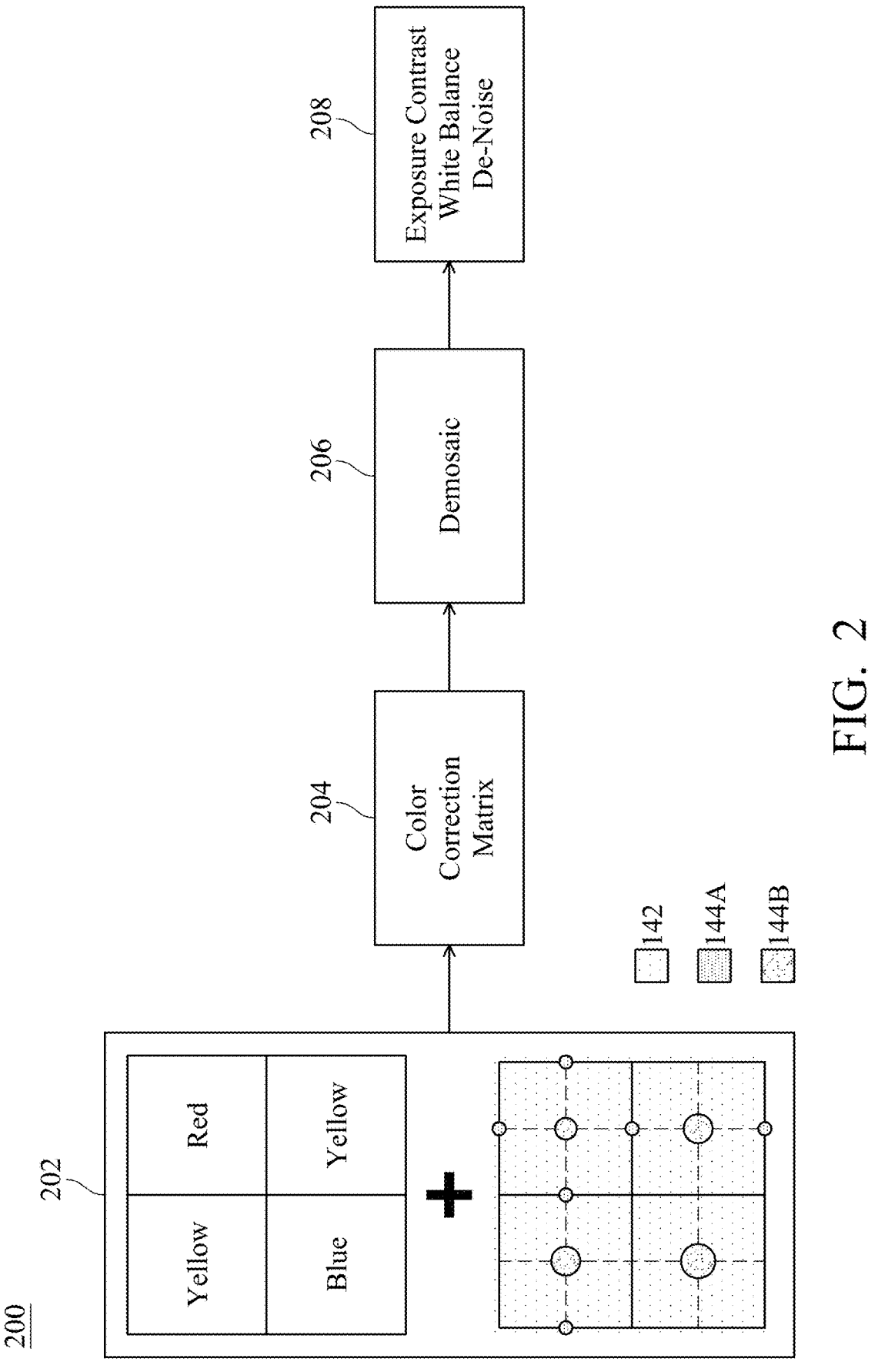
FIG. 2 is a process flow of a method for operating an image signal processor (ISP), according to some embodiments of the present disclosure.

FIG. 2 is a process flow of a method 200 for operating an image signal processor, according to some embodiments of the present disclosure. The method 200 utilized the image sensor 10 described in FIGS. 1A and 1B, so the overall procedures operating the image signal processor may be reduced. In subsequent paragraphs, the operations illustrated in FIG. 2 will be described in detail. It should be noted that additional operations may be provided before, during, and after the method 200, and that some other operations may only be briefly described herein. Although the method 200 may be discussed as being performed in a particular order, other methods may be performed in any logical order.

As shown in FIG. 2, in an operation 202 of the method 200, image signals are captured using the image sensor 10 described in FIGS. 1A and 1B. As mentioned previously, the image sensor 10 includes a pixel of the red color unit, the yellow color unit, the yellow color unit, and the blue color unit that are arranged in 2×2. Additionally, the image sensor 10 incorporates the meta surface 140 to ensure only the green wavelength light ray may be directed toward the yellow color units. In other words, it is no longer necessary to convert the yellow signals into the signals equivalent to those extracted from the green color units, thereby reducing the image signal processor.

Currently, the Bayer pattern (typically including the red color unit, the green color unit, the green color unit, and the blue color unit arranged in the 2×2 array) is the only mosaic technology mature enough to address any potential color variation, as stated above. Whenever an image sensor having color units other than those designated in the Bayer mosaic (for example, the yellow color units or the white color units) is implemented, the signals from other color units must be converted into the signals equivalent to those extracted from the color units of the Bayer mosaic (for example, the green color units). The meta surface 140 of the present invention may compel the yellow color units or the white color units to receive only the green wavelength light ray, so only the green signals may be extracted from the yellow color units or the white color units. Therefore, capturing the image signals corresponding to the Bayer mosaic pattern can be made possible in the operation 202.

As shown in FIG. 2, in an operation 204 of the method 200, a color correction matrix (CCM) may be applied to the signal data. The color correction matrix may be written based on the spectrum of the image signal data captured. It should be understood that every color in nature is constructed by a wide wave band, which means that there is no "pure" color (except in laser tools). Moreover, the displayed color may also be determined by lighting settings or the material characteristics. The matrix itself may include columns of different intensities and rows of different colors, and the electrical signal data captured are to be multiplied by the matrix. In some embodiments, the color correction matrix may be a 3×3 matrix or a 6×6 matrix. The 3×3 matrix may consume less power. While the 6×6 matrix consumes more power, it may be more appropriately applied onto image signal data extracted from less pure colors, which often requires more calculations for conversion. When the signal data are converted into a standard red image data, a standard green image data, and a standard blue image data, the color correction matrix may ensure the calculated colors are as close to the coordinates of the standard colors as possible. Furthermore, the correction mechanism may even eliminate color noise, allowing the standard image data to be used for display.

As shown in FIG. 2, in an operation 206 of the method 200, the image signals undergo demosaicing. When the Bayer pattern is periodically arranged in cycles, the pattern may appear like a mosaic image. A demosaicing algorithm may be used to reconstruct a full color image from the incomplete color samples output from the image sensor. In some embodiments, demosaicing may eliminate fake colors and color noise. By using the demosaicing algorithm, every pixel including the red signal, the green signal, the blue signal, and their relative compositions can be more precisely displayed into colors of higher resolution.

As shown in FIG. 2, in an operation 208 of the method 200, an exposure contrast, a white balance, and denoise on the image signals are performed. The exposure contrast may increase resolution on the image captured in the environment of low luminance. It should be understood that the colors of the captured image may vary depending on the ambient light source. The white balance may incorporate the light source settings to correct the displayed colors, so the colors can be more similar to those viewed by human eyes. In the environment of low luminance, color noise may be particularly notable. Moreover, during device operation, the generated heat may also become unwanted color noise, that causes the restored image to appear less realistic. In some embodiments, the denoise algorithm of the image signal processor can determine the numerical readings of the color noise, which may then be suppressed.

Figure 3A:
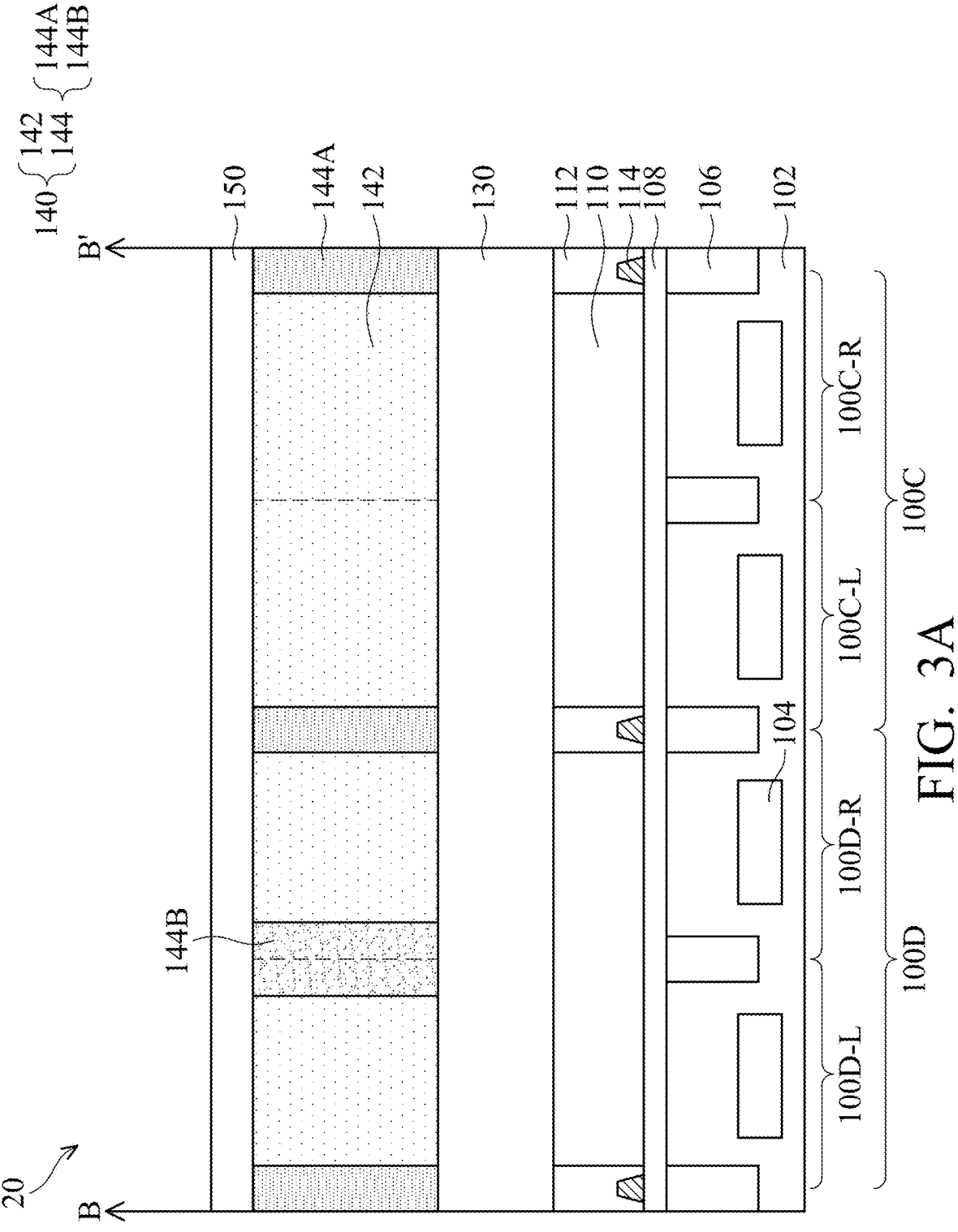
FIG. 3A is a cross-sectional view of an image sensor, according to other embodiments of the present disclosure.

FIG. 3A is a cross-sectional view of an image sensor 20, according to other embodiments of the present disclosure. As mentioned previously, it is imperative to generate a significantly large phase difference, so the light rays of different colors may be split and directed toward different sensor units. The configurations of the meta surface 140 may vary, depending on the application or the design requirements. The features of the substrate 102, the sensing portions 104, the deep trench isolation structure 106, the anti-reflection layer 108, the color filter layer 110, the partition grid structure 112, the light shielding structure 114, the dielectric structure 130, the meta surface 140, and the protective film 150 are similar to those illustrated in FIG. 1A, and the details are not described again herein to avoid repetition.

Referring to FIG. 3A, the cross-sectional view of the image sensor 20 is illustrated. In comparison with FIG. 1A, the group of sensor units 100C and the group of sensor units 100D of the image sensor 20 are displayed. For illustrative purpose, the group of sensor units 100C and the group of sensor units 100D shown in FIG. 3A both include one left sensor unit and one right sensor unit. In particular, the group of sensor units 100C includes a left sensor unit 100C-L and a right sensor unit 100C-R, and the group of sensor units 100D includes a left sensor unit 100D-L and a right sensor unit 100D-R. There is no central nanopost 144B present within the group of sensor units 100C. When the meta surface 140 is incorporated into the image sensor 20, the incident light ray entering the image sensor 20 at a normal direction may be split based on its colors before the incident light ray is being transmitted through the underlying color filter layer 110. Such configuration allows for each color unit of the color filter layer 110 to receive the maximum optical energy of the desired color. In other words, optical energy loss may be minimized, while quantum efficiency may be enhanced.

According to some embodiments of the present disclosure, when the white color units are designed to transmit the red wavelength light ray, the green wavelength light ray, and the blue wavelength light ray, the meta surface 140 may split the red wavelength light ray, the green wavelength light ray, and the blue wavelength light ray, so only the green wavelength light ray may be directed toward the white color units. Due to the presence of the meta surface 140, it is no longer necessary to convert the white signals into the signals equivalent to those extracted from the green color units. As a result, the overall backend fabrication for the white color units may be carried out with lower power consumption, less probability of color error, and higher green color wave band peak (due to higher transmittance).

Figure 3B:
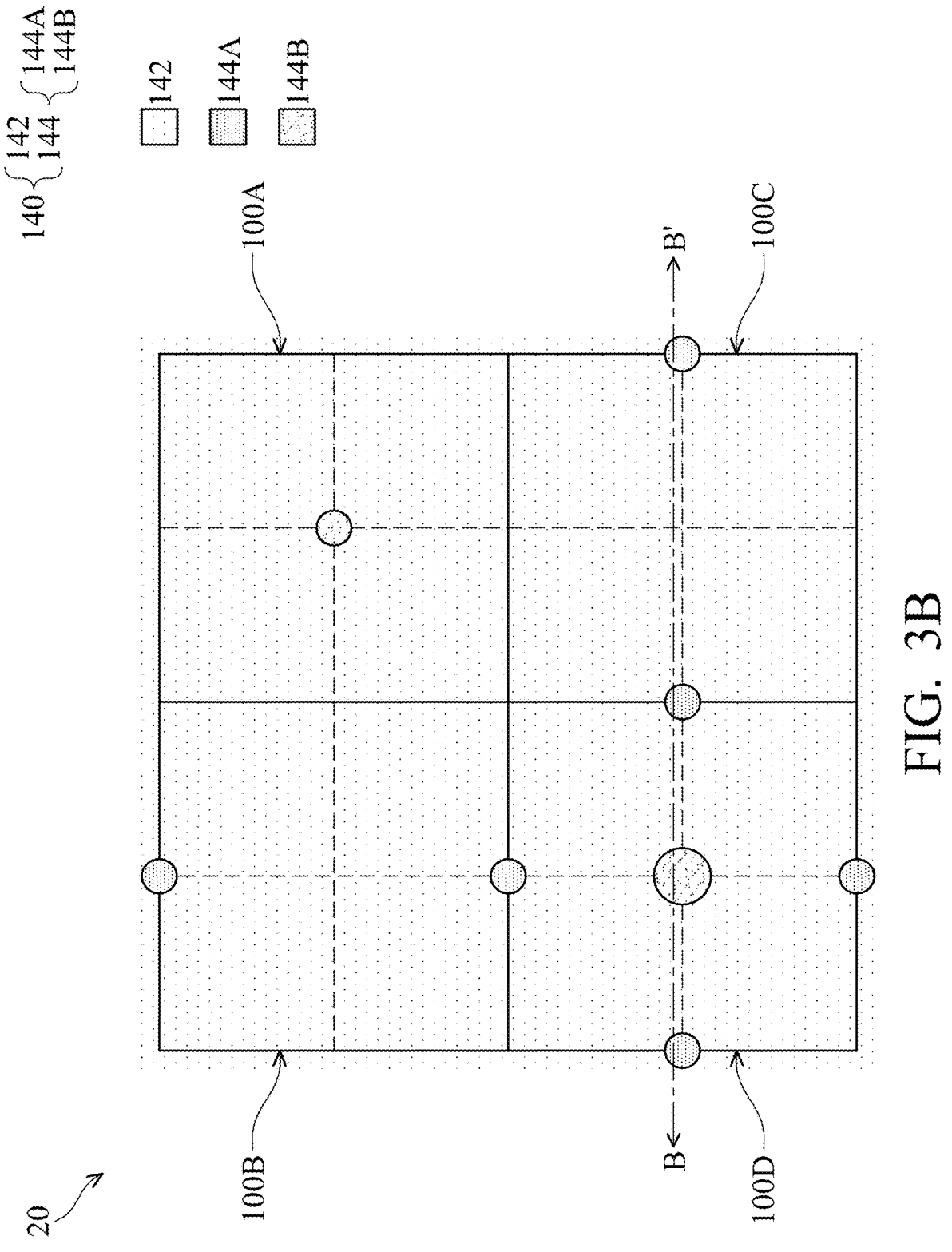
FIG. 3B is a top view of the image sensor, according to other embodiments of the present disclosure.

FIG. 3B is a top view of the image sensor 20, according to other embodiments of the present disclosure. It should be noted that FIG. 3A is the cross-sectional view obtained from a line B-B' of FIG. 3B. As mentioned previously, the group of sensor units 100A, the group of sensor units 100B, the group of sensor units 100C, and the group of sensor units 100D may constitute a pixel with binning mode. The 2×2 pixel array may be periodically arranged in cycles across the actual image sensor. Moreover, the group of sensor units 100A, the group of sensor units 100B, the group of sensor units 100C, and the group of sensor units 100D may each include four sensor units arranged in 2×2. For illustrative purpose, the substrate 102, the sensing portions 104, the deep trench isolation structure 106, the anti-reflection layer 108, the color filter layer 110, the partition grid structure 112, the light shielding structure 114, the dielectric structure 130, and the protective film 150 are omitted. The features of the filling material 142 and the plurality of nanostructures 144 are similar to those illustrated in FIG. 3A, and the details are not described again herein to avoid repetition.

Referring to FIG. 3B, the peripheral nanoposts 144A are disposed in such a way that they are shared by adjacent groups of sensor units, since the group of sensor units 100A, the group of sensor units 100B, the group of sensor units 100C, and the group of sensor units 100D of the pixel are arranged in a 2×2 array from top view, and the pixel array is periodically arranged in cycles. In contrast, the central nanoposts 144B are located within some of the group of sensor units 100A, the group of sensor units 100B, the group of sensor units 100C, and the group of sensor units 100D. There are no central nanoposts 144B present within the group of sensor units 100B and the group of sensor units 100C. From an alternative point of view, instead of considering some of the central nanoposts 144B being omitted, they may also be viewed as being shrunken into an infinitely small dimension.

Still referring to FIG. 3B, in a specific embodiment of the present disclosure, the group of sensor units 100A, the group of sensor units 100B, the group of sensor units 100C, and the group of sensor units 100D may include the red color unit, the white color unit, the white color unit, and the blue color unit, respectively. It should be noted that the group of sensor units 100B and the group of sensor units 100C both include the white color units, thus the plurality of nanostructures 144 (for example, the peripheral nanoposts 144A and the central nanoposts 144B) of the group of sensor units 100B and the group of sensor units 100C may have the same configuration (or no nanostructures 144 are placed therein). It should be understood that, since the white color wave band embodies the entire yellow color wave band, the configuration of the meta surface 140 shown in FIG. 3B may also be utilized for the yellow color units. When the white color units are designed to transmit the red wavelength light ray, the green wavelength light ray, and the blue wavelength light ray, the meta surface 140 may split the red wavelength light ray, the green wavelength light ray, and the blue wavelength light ray, so only the green wavelength light ray may be directed toward the white color units. Due to the presence of the meta surface 140, it is no longer necessary to convert the white signals into the signals equivalent to those extracted from the green color units. As a result, the overall backend fabrication for the white color units may be carried out with lower power consumption, less probability of color error, and higher green color wave band peak (due to higher transmittance).

Figure 4:
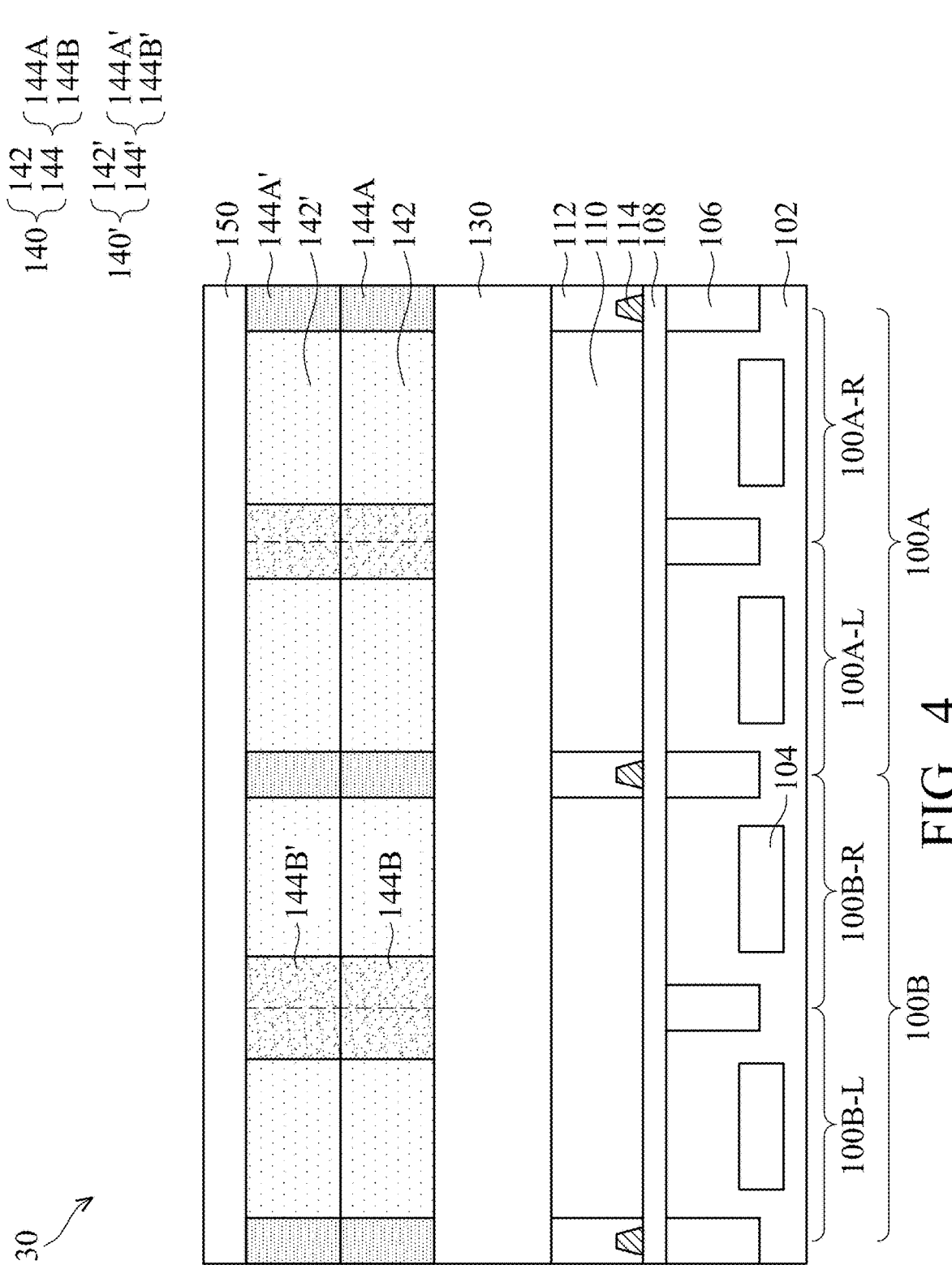
FIG. 4 is a cross-sectional view of an image sensor, according to yet other embodiments of the present disclosure.

FIG. 4 is a cross-sectional view of an image sensor 30, according to yet other embodiments of the present disclosure. As mentioned previously, it is imperative to generate a significantly large phase difference, so the light rays of different colors may be split and directed toward different sensor units. The configurations of the meta surface may vary, depending on the application or the design requirements. The features of the substrate 102, the sensing portions 104, the deep trench isolation structure 106, the anti-reflection layer 108, the color filter layer 110, the partition grid structure 112, the light shielding structure 114, the dielectric structure 130, the meta surface 140, and the protective film 150 are similar to those illustrated in FIG. 1A, and the details are not described again herein to avoid repetition.

Referring to FIG. 4, the cross-sectional view of the image sensor 30 is illustrated. In comparison with FIG. 1A, an additional meta surface 140' is added onto the original meta surface 140. According to some embodiments of the present disclosure, the meta surface 140' may include a filling material 142' and a plurality of nanostructures 144'. Moreover, the plurality of nanostructures 144' may include peripheral nanoposts 144A' and central nanoposts 144B'. When the overall meta surface is designed to be extremely thick, it may be difficult to fabricate a meta surface with a single patterning process due to its large aspect ratio. Therefore, the overall meta surface may be formed with multiple sequentially layers of the meta surface 140 and the meta surface 140'. It should be understood that the meta surface 140 and the meta surface 140' may be shifted (especially near the edge of the image sensor) to respond to an incident light ray at a large inclined angle. With the meta surface of multiple-layer configuration, the incident light ray entering the image sensor 30 may be split based on its colors before the incident light ray is transmitted through the underlying color filter layer 110. As a result, each color unit of the color filter layer 110 may receive the maximum optical energy of the desired color. In other words, optical energy loss may be minimized, while quantum efficiency may be enhanced.

When the yellow color units are designed to transmit the red wavelength light ray and the green wavelength light ray, the meta surface 140 may split the red wavelength light ray and the green wavelength light ray, so only the green wavelength light ray may be directed toward the yellow color units. When the white color units are designed to transmit the red wavelength light ray, the green wavelength light ray, and the blue wavelength light ray, the meta surface 140 may split the red wavelength light ray, the green wavelength light ray, and the blue wavelength light ray, so only the green wavelength light ray may be directed toward the white color units. Because of the presence of the meta surface 140, it is no longer necessary to convert the yellow signals or the white signals into the signals equivalent to those extracted from the green color units. As a result, the overall backend fabrication for the yellow color units or the white color units may be carried out with lower power consumption, less probability of color error, and higher green color wave band peak (due to higher transmittance).

Figure 5:
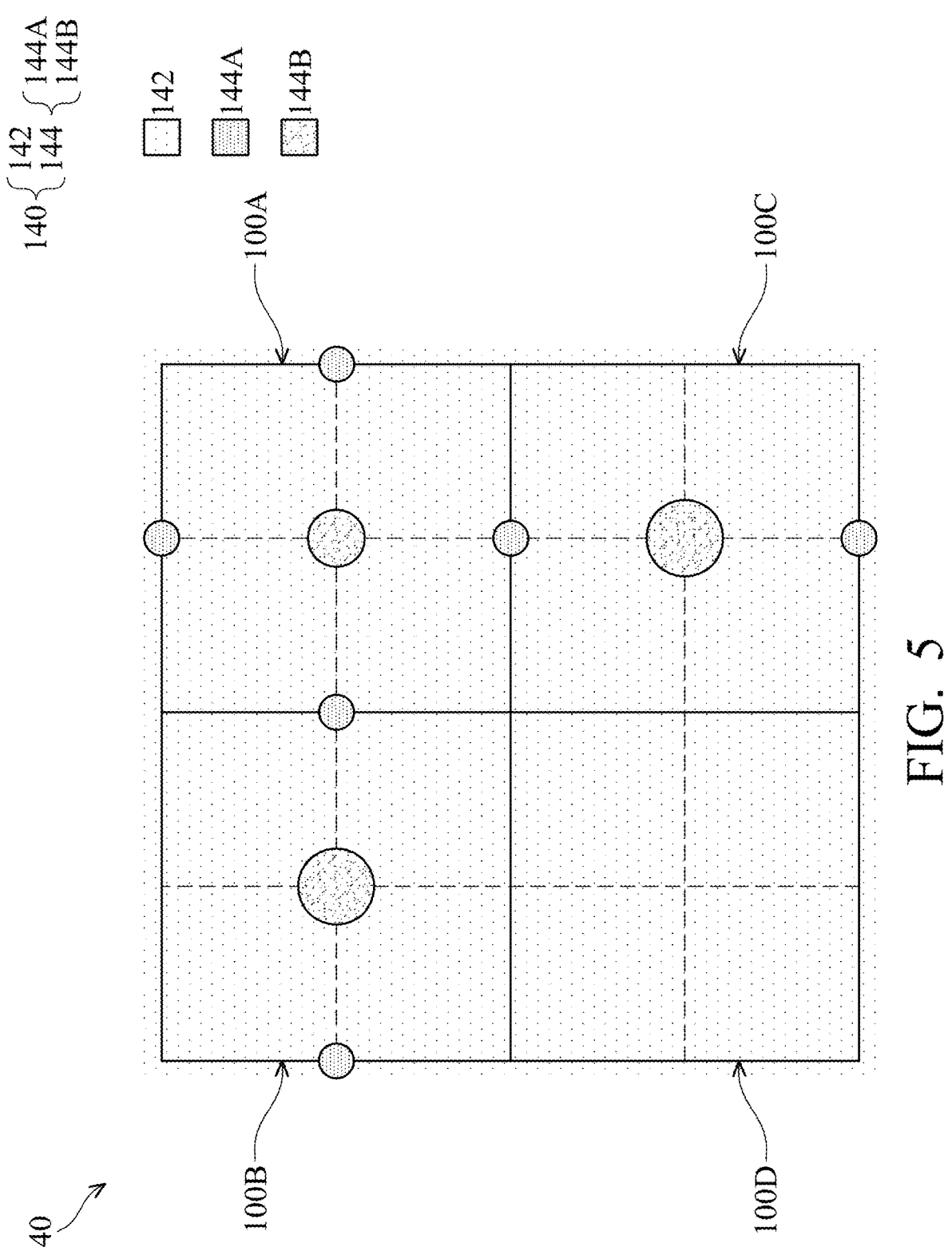
FIGS. 5 and 6 are top views of image sensors with various designs, according to yet other embodiments of the present disclosure.
Figure 6:
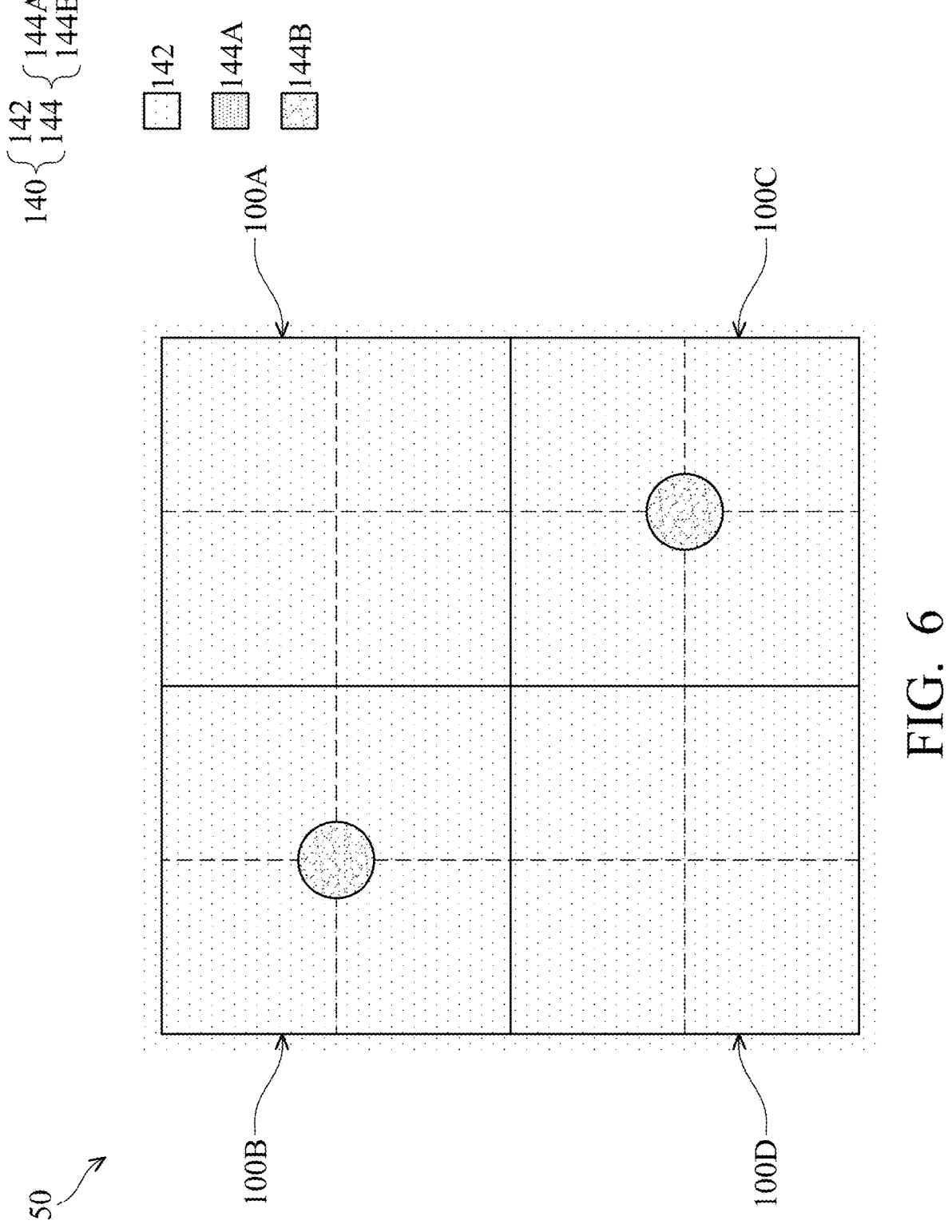

FIGS. 5 and 6 are top views of image sensors 40 and 50 with various designs, according to yet other embodiments of the present disclosure. As mentioned previously, it is imperative to generate a significantly large phase difference, so the light rays of different colors may be split and directed toward different sensor units. The configurations of the meta surface 140 may vary, depending on the application or the design requirements. As mentioned previously, the group of sensor units 100A, the group of sensor units 100B, the group of sensor units 100C, and the group of sensor units 100D may constitute a pixel with binning mode. The 2×2 pixel array may be periodically arranged in cycles across the actual image sensor. Moreover, the group of sensor units 100A, the group of sensor units 100B, the group of sensor units 100C, and the group of sensor units 100D may each include four sensor units arranged in 2×2. For illustrative purpose, the substrate 102, the sensing portions 104, the deep trench isolation structure 106, the anti-reflection layer 108, the color filter layer 110, the partition grid structure 112, the light shielding structure 114, the dielectric structure 130, and the protective film 150 are omitted. The features of the filling material 142 and the plurality of nanostructures 144 are similar to those illustrated in FIG. 1A, and the details are not described again herein to avoid repetition.

Referring to FIG. 5, the top view of the image sensor 40 is illustrated. The peripheral nanoposts 144A are disposed in such a way that they are shared by adjacent groups of sensor units, since the group of sensor units 100A, the group of sensor units 100B, the group of sensor units 100C, and the group of sensor units 100D of the pixel are arranged in a 2×2 array from top view, and the pixel array is periodically arranged in cycles. In contrast, the central nanoposts 144B are located within some of the group of sensor units 100A, the group of sensor units 100B, the group of sensor units 100C, and the group of sensor units 100D. In comparison with FIG. 1B, there is no central nanopost 144B present within the group of sensor units 100D, which may include the blue color unit. From an alternative point of view, instead of considering the central nanopost 144B being omitted, it may also be viewed as being shrunken into an infinitely small dimension.

Still referring to FIG. 5, the meta surface 140 of the image sensor 40 may be implemented for both the yellow color units and the white color units. When the yellow color units are designed to transmit the red wavelength light ray and the green wavelength light ray, the meta surface 140 may split the red wavelength light ray and the green wavelength light ray, so only the green wavelength light ray may be directed toward the yellow color units. When the white color units are designed to transmit the red wavelength light ray, the green wavelength light ray, and the blue wavelength light ray, the meta surface 140 may split the red wavelength light ray, the green wavelength light ray, and the blue wavelength light ray, so only the green wavelength light ray may be directed toward the white color units. Because of the presence of the meta surface 140, it is no longer necessary to convert the yellow signals or the white signals into the signals equivalent to those extracted from the green color units. As a result, the overall backend fabrication for the yellow color units or the white color units may be carried out with lower power consumption, less probability of color error, and higher green color wave band peak (due to higher transmittance).

Referring to FIG. 6, the top view of the image sensor 50 is illustrated. In comparison with FIG. 5, there are only two central nanoposts 144B present within the group of sensor units 100B and the group of sensor units 100C. In other words, there are no nanostructures 144 within the group of sensor units 100A and the group of sensor units 100D, which may include the red color unit and the blue color unit, respectively. From an alternative point of view, instead of considering some of the peripheral nanoposts 144A and the central nanoposts 144B being omitted, they may also be viewed as being shrunken into an infinitely small dimension.

Still referring to FIG. 6, the meta surface 140 of the image sensor 50 may be implemented for both the yellow color units and the white color units. When the yellow color units are designed to transmit the red wavelength light ray and the green wavelength light ray, the meta surface 140 may split the red wavelength light ray and the green wavelength light ray, so only the green wavelength light ray may be directed toward the yellow color units. When the white color units are designed to transmit the red wavelength light ray, the green wavelength light ray, and the blue wavelength light ray, the meta surface 140 may split the red wavelength light ray, the green wavelength light ray, and the blue wavelength light ray, so only the green wavelength light ray may be directed toward the white color units. Due to the presence of the meta surface 140, it is no longer necessary to convert the yellow signals or the white signals into the signals equivalent to those extracted from the green color units. As a result, the overall backend fabrication for the yellow color units or the white color units may be carried out with lower power consumption, less probability of color error, and higher green color wave band peak (due to higher transmittance).

By incorporating the meta surface into a standard image sensor, the incident light ray of different colors may be split and directed toward different sensor units, so that optical energy loss may be minimized, while quantum efficiency may be enhanced. When the yellow color units or the white color units are implemented to replace the green color units to increase transmittance in the environment of low luminance (or in blackness), the meta surface may compel the yellow color units or the white color units to receive only the green wavelength light ray, so only the green signals may be extracted from the yellow color units or the white color units. As a result, the overall backend fabrication (for operating the image signal processor) for the yellow color units or the white color units may be carried out with lower power consumption, less probability of color error, and higher green color wave band peak (due to higher transmittance).

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:
   groups of sensor units;
   a color filter layer having color units that disposed within the groups of sensor units, respectively, wherein the color units comprise a yellow color unit or a white color unit;
   a dielectric structure disposed on the color filter layer; and
   a meta surface disposed on the dielectric structure,
   wherein the meta surface further comprising:
   a plurality of nanostructures; and
   a filling material laterally surrounding the plurality of nanostructures.

2. The image sensor of claim 1, wherein the yellow color unit of the color filter layer is designed to transmit a red wavelength light ray and a green wavelength light ray, and the meta surface is configured to split the red wavelength light ray and the green wavelength light ray, so only the green wavelength light ray is directed toward the yellow color unit.

3. The image sensor of claim 1, wherein the white color unit of the color filter layer is designed to transmit a red wavelength light ray, a green wavelength light ray, and a blue wavelength light ray, and the meta surface is configured to split the red wavelength light ray, the green wavelength light ray, and the blue wavelength light ray, so only the green wavelength light ray is directed toward the white color unit.

4. The image sensor of claim 1, wherein the filling material is air.

5. The image sensor of claim 1, wherein a refractive index of the filling material is between 1.0 and 1.7.

6. The image sensor of claim 5, wherein a refractive index of the plurality of nanostructures is between 1.8 and 3.5, and the refractive index of the plurality of nanostructures is higher than the refractive index of the filling material.

7. The image sensor of claim 1, wherein a dimension of each of the plurality of nanostructures from top view is between 90 nm and 1 μm.

8. The image sensor of claim 1, wherein the plurality of nanostructures further comprising:
   peripheral nanoposts located at perimeters of the groups of sensor units from top view; and
   central nanoposts located at center points of the groups of sensor units from top view.

9. The image sensor of claim 1, wherein the groups of sensor units further comprising a first group of sensor units, a second group of sensor units, a third group of sensor units, and a fourth group of sensor units.

10. The image sensor of claim 9, further comprising:

a red color unit of the color filter layer disposed within the first group of sensor units;

the yellow color unit of the color filter layer disposed within the second group of sensor units;

the yellow color unit of the color filter layer disposed within the third group of sensor units; and a blue color unit of the color filter layer disposed within the fourth group of sensor units.

11. The image sensor of claim 9, further comprising:

a red color unit of the color filter layer disposed within the first group of sensor units;

the white color unit of the color filter layer disposed within the second group of sensor units;

the white color unit of the color filter layer disposed within the third group of sensor units; and a blue color unit of the color filter layer disposed within the fourth group of sensor units.

12. The image sensor of claim 9, wherein the first group of sensor units, the second group of sensor units, the third group of sensor units, and the fourth group of sensor units constitute a pixel arranged in an array of 2×2 from top view, and the array is periodically arranged in cycles across the image sensor.

13. The image sensor of claim 1, wherein a thickness of the meta surface is between 200 nm and 1.5 μm, and a thickness of the dielectric structure is between 0.1 μm and 3 μm.

14. The image sensor of claim 1, wherein a refractive index of the color filter layer is between 1.2 and 2.2.

15. The image sensor of claim 1, wherein a refractive index of the dielectric structure is between 1.2 and 2.2.

16. The image sensor of claim 1, further comprising:

a plurality of sensing portions embedded within a substrate; and a deep trench isolation (DTI) structure separating each of the plurality of sensing portions.

17. The image sensor of claim 1, further comprising:

a partition grid structure laterally surrounding each of the color units of the color filter layer within the groups of sensor units, wherein a refractive index of the partition grid structure is between 1.0 and 1.6;

a light shielding structure embedded within the partition grid structure; and a protective film disposed on the meta surface, wherein a refractive index of the protective film is between 1.4 and 1.6.

\* \* \* \* \*